United States Patent
Li et al.

(10) Patent No.: US 9,219,503 B2
(45) Date of Patent: Dec. 22, 2015

(54) SYSTEMS AND METHODS FOR MULTI-ALGORITHM CONCATENATION ENCODING AND DECODING

(71) Applicant: LSI Corporation, San Jose, CA (US)

(72) Inventors: Shu Li, San Jose, CA (US); Fan Zhang, Milpitas, CA (US); Bruce A. Wilson, San Jose, CA (US); Jun Xiao, Fremont, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 135 days.

(21) Appl. No.: 14/072,604

(22) Filed: Nov. 5, 2013

(65) Prior Publication Data
US 2015/0106675 A1    Apr. 16, 2015

Related U.S. Application Data

(60) Provisional application No. 61/891,559, filed on Oct. 16, 2013.

(51) Int. Cl.
*H03M 13/00* (2006.01)
*H03M 13/29* (2006.01)
*H03M 13/11* (2006.01)
*H03M 13/15* (2006.01)

(52) U.S. Cl.
CPC ........ *H03M 13/2942* (2013.01); *H03M 13/293* (2013.01); *H03M 13/2906* (2013.01); *H03M 13/2909* (2013.01); *H03M 13/2957* (2013.01); *H03M 13/6343* (2013.01); *H03M 13/1102* (2013.01); *H03M 13/1515* (2013.01)

(58) Field of Classification Search
CPC ............... H03M 13/2942; H03M 13/1102; H03M 13/1515; H03M 13/2906
USPC ................................................. 714/755, 784
See application file for complete search history.

(56) References Cited

U.S. PATENT DOCUMENTS

| | | |
|---|---|---|
| 4,553,221 A | 11/1985 | Hyatt |
| 4,805,174 A | 2/1989 | Kubot |
| 5,278,703 A | 1/1994 | Rub et al. |
| 5,278,846 A | 1/1994 | Okayama |
| 5,317,472 A | 5/1994 | Schweitzer, III |
| 5,325,402 A | 6/1994 | Ushirokawa |

(Continued)

FOREIGN PATENT DOCUMENTS

| | | |
|---|---|---|
| JP | 2001/319433 A | 11/2001 |
| WO | WO 2010/059264 A1 | 5/2010 |
| WO | WO 2010/126482 A1 | 11/2010 |

OTHER PUBLICATIONS

U.S. Appl. No. 13/426,714, filed Mar. 22, 2012, Shaohua Yang.

(Continued)

*Primary Examiner* — David Ton

(57) ABSTRACT

Systems and method relating generally to data processing, and more particularly to systems and methods for encoding and decoding information. Some embodiments include one or both of a multi-algorithm data encoder circuit and/or a multi-algorithm data decoder circuit. In some cases, a first algorithm encoding is applied on a first section by section basis to a user data set yield an encoded portion; and a second algorithm encoding is applied on a second section by section basis to a data set derived from a subset of the encoded portion.

20 Claims, 8 Drawing Sheets

(56) References Cited

U.S. PATENT DOCUMENTS

| | | |
|---|---|---|
| 5,351,274 A | 9/1994 | Chennakeshu |
| 5,392,299 A | 2/1995 | Rhines |
| 5,406,593 A | 4/1995 | Chennakeshu |
| 5,417,500 A | 5/1995 | Martinie |
| 5,450,253 A | 9/1995 | Seki |
| 5,513,192 A | 4/1996 | Janku |
| 5,523,903 A | 6/1996 | Hetzler |
| 5,550,810 A | 8/1996 | Monogioudis et al. |
| 5,550,870 A | 8/1996 | Blaker |
| 5,612,964 A | 3/1997 | Haraszti |
| 5,696,504 A | 12/1997 | Oliveros |
| 5,710,784 A | 1/1998 | Kindred |
| 5,717,706 A | 2/1998 | Ikeda |
| 5,719,871 A | 2/1998 | Helm |
| 5,802,118 A | 9/1998 | Bliss |
| 5,844,945 A | 12/1998 | Nam |
| 5,898,710 A | 4/1999 | Amrany |
| 5,923,713 A | 7/1999 | Hatakeyama |
| 5,978,414 A | 11/1999 | Nara |
| 5,983,383 A | 11/1999 | Wolf |
| 6,005,897 A | 12/1999 | Mccalissister |
| 6,023,783 A | 2/2000 | Divsalar |
| 6,029,264 A | 2/2000 | Kobayashi |
| 6,065,149 A | 5/2000 | Yamanaka |
| 6,097,764 A | 8/2000 | McCallister |
| 6,145,110 A | 11/2000 | Khayrallah |
| 6,175,588 B1 | 1/2001 | Visotsky |
| 6,216,249 B1 | 4/2001 | Bliss |
| 6,216,251 B1 | 4/2001 | McGinn |
| 6,266,795 B1 | 7/2001 | Wei |
| 6,317,472 B1 | 11/2001 | Choi |
| 6,351,832 B1 | 2/2002 | Wei |
| 6,377,610 B1 | 4/2002 | Hagenauer |
| 6,381,726 B1 | 4/2002 | Weng |
| 6,393,074 B1 | 5/2002 | Mandyam |
| 6,412,088 B1 | 6/2002 | Patapoutian et al. |
| 6,473,878 B1 | 10/2002 | Wei |
| 6,535,553 B1 | 3/2003 | Limberg et al. |
| 6,625,775 B1 | 9/2003 | Kim |
| 6,643,814 B1 | 11/2003 | Cideciyan et al. |
| 6,697,441 B1 | 2/2004 | Bottomley |
| 6,747,827 B1 | 6/2004 | Bassett et al. |
| 6,748,034 B2 | 6/2004 | Hattori |
| 6,757,862 B1 | 6/2004 | Marianetti, II |
| 6,785,863 B2 | 8/2004 | Blankenship |
| 6,807,238 B1 | 10/2004 | Rhee |
| 6,810,502 B2 | 10/2004 | Eidson |
| 6,839,774 B1 | 1/2005 | Ahn et al. |
| 6,948,113 B1 | 9/2005 | Shaver |
| 6,970,511 B1 | 11/2005 | Barnette |
| 6,975,692 B2 | 12/2005 | Razzell |
| 6,986,098 B2 | 1/2006 | Poeppelman |
| 7,035,327 B2 | 4/2006 | Nakajima et al. |
| 7,047,474 B2 | 5/2006 | Rhee |
| 7,058,873 B2 | 6/2006 | Song et al. |
| 7,073,118 B2 | 7/2006 | Greenberg |
| 7,093,179 B2 | 8/2006 | Shea |
| 7,117,427 B2 | 10/2006 | Ophir |
| 7,133,228 B2 | 11/2006 | Fung |
| 7,136,244 B1 | 11/2006 | Rothberg |
| 7,184,486 B1 | 2/2007 | Wu |
| 7,191,378 B2 | 3/2007 | Eroz |
| 7,203,887 B2 | 4/2007 | Eroz |
| 7,230,550 B1 | 6/2007 | Mittal |
| 7,237,181 B2 | 6/2007 | Richardson |
| 7,308,061 B1 | 12/2007 | Huang |
| 7,310,768 B2 | 12/2007 | Eidson |
| 7,313,750 B1 | 12/2007 | Feng |
| 7,370,258 B2 | 5/2008 | Iancu |
| 7,415,651 B2 | 8/2008 | Argon |
| 7,502,189 B2 | 3/2009 | Sawaguchi |
| 7,523,375 B2 | 4/2009 | Spencer |
| 7,587,657 B2 | 9/2009 | Haratsch |
| 7,590,168 B2 | 9/2009 | Raghavan |
| 7,596,196 B1 | 9/2009 | Liu et al. |
| 7,646,829 B2 | 1/2010 | Ashley |
| 7,702,986 B2 | 4/2010 | Bjerke |
| 7,738,202 B1 | 6/2010 | Zheng |
| 7,752,523 B1 | 7/2010 | Chaichanavong |
| 7,779,325 B2 | 8/2010 | Song |
| 7,802,172 B2 | 9/2010 | Vila Casado et al. |
| 7,952,824 B2 | 5/2011 | Dziak |
| 7,957,251 B2 | 6/2011 | Ratnakar Aravind |
| 7,958,425 B2 | 6/2011 | Chugg |
| 7,996,746 B2 | 8/2011 | Livshitz |
| 8,018,360 B2 | 9/2011 | Nayak |
| 8,020,069 B1 | 9/2011 | Feng |
| 8,020,078 B2 | 9/2011 | Richardson |
| 8,161,361 B1 | 4/2012 | Song et al. |
| 8,201,051 B2 | 6/2012 | Tan |
| 8,225,168 B2 | 7/2012 | Yu et al. |
| 8,237,597 B2 | 8/2012 | Liu |
| 8,255,765 B1 | 8/2012 | Yeo |
| 8,261,167 B1* | 9/2012 | Northcott ..................... 714/786 |
| 8,261,171 B2 | 9/2012 | Annampedu |
| 8,291,284 B2 | 10/2012 | Savin |
| 8,291,299 B2 | 10/2012 | Ii |
| 8,295,001 B2 | 10/2012 | Liu |
| 8,296,637 B1 | 10/2012 | Varnica |
| 8,370,711 B2 | 2/2013 | Alrod |
| 8,381,069 B1 | 2/2013 | Liu |
| 8,413,032 B1 | 4/2013 | Song |
| 8,419,547 B1* | 4/2013 | Radek ............................ 463/42 |
| 8,429,498 B1 | 4/2013 | Anholt |
| 8,443,267 B2 | 5/2013 | Zhong et al. |
| 8,458,555 B2 | 6/2013 | Gunnam |
| 8,464,142 B2 | 6/2013 | Gunnam |
| 8,495,462 B1 | 7/2013 | Liu |
| 8,516,339 B1 | 8/2013 | Lesea |
| 8,527,849 B2 | 9/2013 | Jakab |
| 8,560,900 B1 | 10/2013 | Bellorado |
| 8,671,326 B1* | 3/2014 | Tang et al. ..................... 714/758 |
| 2001/0010089 A1 | 7/2001 | Gueguen |
| 2001/0016114 A1 | 8/2001 | Van Gestel et al. |
| 2002/0021519 A1 | 2/2002 | Rae |
| 2002/0053049 A1* | 5/2002 | Shiomoto et al. ............. 714/701 |
| 2002/0067780 A1 | 6/2002 | Razzell |
| 2002/0168033 A1 | 11/2002 | Suzuki |
| 2003/0031236 A1 | 2/2003 | Dahlman |
| 2003/0123364 A1 | 7/2003 | Nakajima et al. |
| 2003/0126527 A1 | 7/2003 | Kim et al. |
| 2003/0138102 A1 | 7/2003 | Kohn et al. |
| 2003/0188252 A1 | 10/2003 | Kim |
| 2004/0042436 A1 | 3/2004 | Terry et al. |
| 2004/0194007 A1 | 9/2004 | Hocevar |
| 2004/0228021 A1 | 11/2004 | Yamazaki |
| 2004/0264284 A1 | 12/2004 | Priborsky et al. |
| 2005/0047514 A1 | 3/2005 | Bolinth |
| 2005/0149842 A1 | 7/2005 | Kyung |
| 2005/0210367 A1 | 9/2005 | Ashikhmin |
| 2005/0243456 A1 | 11/2005 | Mitchell et al. |
| 2006/0002689 A1 | 1/2006 | Yang et al. |
| 2006/0159355 A1 | 7/2006 | Mizuno |
| 2006/0195730 A1 | 8/2006 | Kageyama |
| 2007/0185902 A1 | 8/2007 | Messinger et al. |
| 2007/0234178 A1 | 10/2007 | Richardson |
| 2007/0297496 A1 | 12/2007 | Park et al. |
| 2008/0037676 A1 | 2/2008 | Kyun et al. |
| 2008/0069373 A1 | 3/2008 | Jiang |
| 2008/0140686 A1 | 6/2008 | Hong |
| 2008/0304558 A1 | 12/2008 | Zhu et al. |
| 2009/0003301 A1 | 1/2009 | Reial |
| 2009/0092174 A1 | 4/2009 | Wang |
| 2009/0106633 A1 | 4/2009 | Fujiwara |
| 2009/0125780 A1 | 5/2009 | Taylor |
| 2009/0129484 A1* | 5/2009 | He et al. ..................... 375/240.26 |
| 2009/0132893 A1 | 5/2009 | Miyazaki |
| 2009/0150745 A1 | 6/2009 | Langner et al. |
| 2009/0177852 A1 | 7/2009 | Chen |
| 2009/0185643 A1 | 7/2009 | Fitzpatrick |
| 2009/0210436 A1* | 8/2009 | Tirpak ........................... 707/101 |
| 2009/0216942 A1 | 8/2009 | Yen |
| 2009/0273492 A1 | 11/2009 | Yang et al. |
| 2010/0077276 A1 | 3/2010 | Okamura et al. |

(56) References Cited

U.S. PATENT DOCUMENTS

| | | | |
|---|---|---|---|
| 2010/0088575 | A1 | 4/2010 | Sharon et al. |
| 2010/0150252 | A1 | 6/2010 | Camp |
| 2010/0172046 | A1 | 7/2010 | Liu et al. |
| 2010/0241921 | A1 | 9/2010 | Gunam |
| 2010/0268996 | A1 | 10/2010 | Yang |
| 2010/0322048 | A1 | 12/2010 | Yang et al. |
| 2010/0325511 | A1 | 12/2010 | Oh |
| 2011/0041040 | A1 | 2/2011 | Su |
| 2011/0043938 | A1 | 2/2011 | Mathew |
| 2011/0066768 | A1 | 3/2011 | Brittner et al. |
| 2011/0167227 | A1 | 7/2011 | Yang |
| 2011/0258508 | A1 | 10/2011 | Ivkovic |
| 2011/0264987 | A1 | 10/2011 | Li |
| 2011/0307760 | A1 | 12/2011 | Pisek |
| 2011/0320902 | A1 | 12/2011 | Gunnam |
| 2012/0020402 | A1 | 1/2012 | Ibing |
| 2012/0038998 | A1 | 2/2012 | Mathew |
| 2012/0063023 | A1 | 3/2012 | Mathew |
| 2012/0079353 | A1 | 3/2012 | Liikanen |
| 2012/0124118 | A1 | 5/2012 | Ivkovic |
| 2012/0182643 | A1 | 7/2012 | Zhang |
| 2012/0185744 | A1 | 7/2012 | Varnica |
| 2012/0203986 | A1 | 8/2012 | Strasser et al. |
| 2012/0207201 | A1 | 8/2012 | Xia |
| 2012/0212849 | A1 | 8/2012 | Xu |
| 2012/0236428 | A1 | 9/2012 | Xia |
| 2012/0262814 | A1 | 10/2012 | Li |
| 2012/0265488 | A1 | 10/2012 | Sun |
| 2012/0317462 | A1 | 12/2012 | Liu et al. |
| 2013/0013974 | A1* | 1/2013 | Cideciyan et al. ............ 714/755 |
| 2013/0024740 | A1 | 1/2013 | Xia |
| 2013/0031440 | A1 | 1/2013 | Sharon |
| 2013/0091400 | A1* | 4/2013 | Xia et al. ...................... 714/755 |
| 2013/0120169 | A1 | 5/2013 | Li |
| 2013/0194955 | A1 | 8/2013 | Chang |
| 2013/0198580 | A1 | 8/2013 | Chen |
| 2013/0238955 | A1 | 9/2013 | D'Abreu |
| 2013/0254616 | A1 | 9/2013 | Yang |
| 2013/0254619 | A1 | 9/2013 | Zhang |

OTHER PUBLICATIONS

Casado et al., Multiple-rate low-density parity-check codes with constant blocklength, IEEE Transations on communications, Jan. 2009, vol. 57, pp. 75-83.

Cui et al., "High-Throughput Layered LDPC Decoding Architecture", IEEE Transactions on Very Large Scale Integration (VLSI) Systems, vol. 17, No. 4 (Apr. 2009).

Fan et al., "Constrained coding techniques for soft iterative decoders" Proc. IEEE Global Telecommun. Conf., vol. 1b, pp. 631-637 (1999).

Fossorier, Marc P.C. "Quasi-Cyclic Low-Density Parity-Check Codes From Circulant Permutation Maricies" IEEE Transactions on Information Theory, vol. 50, No. 8 Aug. 8, 2004.

Gross, "Stochastic Decoding of LDPC Codes over GF(q)", HDPCC Workshop, Tel Aviv (Mar. 2, 2010).

Gunnam et al., "VLSI Architectures for Layered Decoding for Irregular LDPC Codes of WiMax", IEEE ICC Proceedings (2007).

Hagenauer, J. et al A Viterbi Algorithm with Soft-Decision Outputs and its Applications in Proc. IEEE Globecom, pp. 47. 11-47 Dallas, TX Nov. 1989.

Han and Ryan, "Pinning Techniques for Low-Floor Detection/Decoding of LDPC-Coded Partial Response Channels", 5th International Symposium on Turbo Codes &Related Topics, 2008.

Kautz, "Fibonacci Codes for Synchronization Control", IEEE Trans. Info. Theory, vol. 11, No. 2, pp. 284-292 (Apr. 1965).

Kschischang et al., "Factor Graphs and the Sum-Product Algorithm", IEEE Transactions on Information Theory, vol. 47, No. 2 (Feb. 2001).

Leduc-Primeau et al., "A Relaxed Half-Stochastic Iterative Decoder for LDPC Codes", IEEE Communications Society, IEEE Globecom proceedings (2009).

Lee et al., "Partial Zero-Forcing Adaptive MMSE Receiver for DS-CDMA Uplink in Multicell Environments" IEEE Transactions on Vehicular Tech. vol. 51, No. 5, Sep. 2002.

Li et al "Efficient Encoding of Quasi-Cyclic Low-Density Parity Check Codes" IEEE Transactions on Communications on 53 (11) 1973-1973, 2005.

Lim et al. "Convergence Analysis of Constrained Joint Adaptation in Recording Channels" IEEE Trans. on Signal Processing vol. 54, No. 1 Jan. 2006.

Lin et al "An efficient VLSI Architecture for non binary LDPC decoders"—IEEE Transaction on Circuits and Systems II vol. 57, Issue 1 (Jan. 2010) pp. 51-55.

Moon et al, "Pattern-dependent noise prediction in signal-dependent Noise," IEEE JSAC, vol. 19, No. 4 pp. 730-743, Apr. 2001.

Moon et al., "Maximum transition run codes for data storage systems", IEEE Trans. Magn., vol. 32, No. 5, pp. 3992-3994 (Sep. 1996).

Patapoutian et al "Improving Re-Read Strategies by Waveform Averaging" IEEE Transactions on Mag. vol. 37 No. 6, Nov. 2001.

Richardson, T "Error Floors of LDPC Codes" Flarion Technologies Bedminster NJ 07921, tjr@flarion.com (not dated).

Shokrollahi "LDPC Codes: An Introduction", Digital Fountain, Inc. (Apr. 2, 2003).

Spagnol et al, "Hardware Implementation of GF(2m) LDPC Decoders", IEEE Transactions on Circuits and Systemsši: Regular Papers, vol. 56, No. 12 (Dec. 2009).

Tehrani et al., "Fully Parallel Stochastic LDPC Decoders", IEEE Transactions on Signal Processing, vol. 56, No. 11 (Nov. 2008).

Todd et al., "Enforcing maximum-transition-run code constraints and low-density parity check decoding", IEEE Trans. Magn., vol. 40, No. 6, pp. 3566-3571 (Nov. 2004).

U.S. Appl. No. 13/227,544, filed Sep. 8, 2011, Shaohua Yang Unpublished.

U.S. Appl. No. 13/369,468, filed Feb. 9, 2012, Zongwang Li Unpublished.

U.S. Appl. No. 13/340,951, filed Dec. 30, 2011, Lei Chen Unpublished.

U.S. Appl. No. 13/445,848, filed Apr. 12, 2012, Bruce Wilson Unpublished.

U.S. Appl. No. 13/340,974, filed Dec. 30, 2011, Dan Liu Unpublished.

U.S. Appl. No. 13/545,833, filed Jul. 10, 2012, Zhi Bin Li Unpublished.

U.S. Appl. No. 14/025,104, filed Sep. 12, 2013, Bruce Wilson Unpublished.

U.S. Appl. No. 13/239,683, filed Sep. 22, 2011, Changyou Xu Unpublished.

U.S. Appl. No. 13/283,549, filed Oct. 27, 2011, Wu Chang Unpublished.

U.S. Appl. No. 13/186,234, filed Jul. 19, 2011, Haitao Xia Unpublished.

U.S. Appl. No. 13/180,495, filed Jul. 11, 2011, Chung-Li Wang Unpublished.

U.S. Appl. No. 13/300,078, filed Nov. 18, 2011, Chung-Li Wang Unpublished.

U.S. Appl. No. 13/302,119, filed Nov. 22, 2011, Lei Chen Unpublished.

U.S. Appl. No. 13/305,510, filed Nov. 28, 2011, Lei Chen Unpublished.

U.S. Appl. No. 13/227,416, filed Sep. 7, 2011, Lei Chen Unpublished.

U.S. Appl. No. 13/305,551, filed Nov. 28, 2011, Yang Han Unpublished.

U.S. Appl. No. 13/296,022, filed Nov. 14, 2011, Victor Krachkovsky Unpublished.

U.S. Appl. No. 13/445,878, filed Apr. 12, 2012, Yu Liao Unpublished.

U.S. Appl. No. 13/174,537, filed Jun. 30, 2011, Anantha Raman Krishnan Unpublished.

U.S. Appl. No. 13/269,832, filed Oct. 10, 2011, Haitao Xia Unpublished.

U.S. Appl. No. 13/171,615, filed Jun. 29, 2011, Bradley D. Seago Unpublished.

U.S. Appl. No. 13/213,751, filed Aug. 19, 2011, Fan Zhang Unpublished.

U.S. Appl. No. 13/174,453, filed Jun. 30, 2011, Johnson Yen Unpublished.

(56) References Cited

OTHER PUBLICATIONS

U.S. Appl. No. 13/868,779, filed Apr. 23, 2013, Fan Zhang Unpublished.
U.S. Appl. No. 13/483,105, filed May 30, 2012, Xuebin Wu Unpublished.
U.S. Appl. No. 13/284,767, filed Oct. 28, 2011, Fan Zhang Unpublished.
U.S. Appl. No. 13/652,012, filed Oct. 15, 2012, Fan Zhang Unpublished.
U.S. Appl. No. 13/327,279, filed Dec. 15, 2011, Wei Feng Unpublished.
U.S. Appl. No. 13/746,301, filed Jan. 21, 2013, Shu Li Unpublished.
U.S. Appl. No. 13/766,911, filed Feb. 14, 2013, Shaohua Yang Unpublished.
U.S. Appl. No. 13/766,891, filed Feb. 14, 2013, Shu Li Unpublished.
U.S. Appl. No. 13/875,357, filed May 2, 2013, Shaohua Yang Unpublished.
U.S. Appl. No. 13/945,787, filed Jul. 18, 2013, Shu Li Unpublished.
U.S. Appl. No. 13/483,100, filed May 30, 2012, Fan Zhang Unpublished.
U.S. Appl. No. 13/944,966, filed Jul. 18, 2013, Fan Zhang Unpublished.
U.S. Appl. No. 13/426,693, filed Mar. 22, 2012, Shaohua Yang Unpublished.
U.S. Appl. No. 13/853,711, filed Mar. 29, 2013, Shu Li Unpublished.
U.S. Appl. No. 13/918,510, filed Jun. 14, 2013, Shu Li Unpublished.
U.S. Appl. No. 13/770,008, filed Feb. 19, 2013, Shaohua Yang Unpublished.
U.S. Appl. No. 13/912,059, filed Jun. 6, 2013, Fan Zhang Unpublished.
U.S. Appl. No. 13/954,573, filed Jul. 30, 2013, Kaitlyn T. Nguyen Unpublished.
U.S. Appl. No. 14/047,441, filed Oct. 7, 2013, Haitao Xia Unpublished.
U.S. Appl. No. 14/047,319, filed Oct. 7, 2013, Shaohua Yang Unpublished.
U.S. Appl. No. 14/026,722, filed Sep. 13, 2013, Shaohua Yang Unpublished.
U.S. Appl. No. 13/945,777, filed Jul. 18, 2013, Shu Li Unpublished.
U.S. Appl. No. 13/295,150, filed Nov. 14, 2011, Zongwang Li Unpublished.
U.S. Appl. No. 13/474,660, filed May 17, 2012, Zongwang Li Unpublished.
U.S. Appl. No. 13/433,693, filed Mar. 29, 2012, Fan Zhang Unpublished.
U.S. Appl. No. 13/596,819, filed Aug. 28, 2012, Shaohua Yang Unpublished.
U.S. Appl. No. 13/596,947, filed Aug. 28, 2012, Fan Zhang Unpublished.
U.S. Appl. No. 13/372,580, filed Feb. 14, 2012, Fan Zhang Unpublished.
U.S. Appl. No. 13/426,714, filed Mar. 22, 2012, Shaohua Yang Unpublished.
U.S. Appl. No. 13/705,407, filed Dec. 5, 2012, Lingyan Sun Unpublished.
U.S. Appl. No. 13/412,520, filed Mar. 5, 2012, Fan Zhang Unpublished.
U.S. Appl. No. 13/362,409, filed Jan. 31, 2012, Fan Zhang Unpublished.
U.S. Appl. No. 13/422,986, filed Mar. 16, 2012, Fan Zhang Unpublished.
U.S. Appl. No. 13/284,730, filed Oct. 28, 2011, Fan Zhang Unpublished.
U.S. Appl. No. 13/596,978, filed Aug. 28, 2012, Fan Zhang Unpublished.
U.S. Appl. No. 13/597,001, filed Aug. 28, 2012, Fan Zhang Unpublished.
U.S. Appl. No. 13/619,907, filed Sep. 14, 2012, Fan Zhang Unpublished.
U.S. Appl. No. 13/621,341, filed Sep. 17, 2012, Shaohua Yang Unpublished.
U.S. Appl. No. 13/989,583, filed Oct. 15, 2012, Shaohua Yang Unpublished.
U.S. Appl. No. 13/269,852, filed Oct. 10, 2011, Haitao Xia Unpublished.
U.S. Appl. No. 13/113,219, filed May 23, 2011, Yang Han Unpublished.
U.S. Appl. No. 13/415,430, filed Mar. 8, 2012, Nayak Ratnakar Aravind Unpublished.
U.S. Appl. No. 13/316,741, filed Dec. 12, 2011, Yang Han Unpublished.
U.S. Appl. No. 13/415,326, filed Mar. 8, 2012, Shaohua Yang Unpublished.
U.S. Appl. No. 13/316,858, filed Dec. 12, 2011, Zongwang Li Unpublished.
Vasic, B., "High-Rate Girth-Eight Codes on Rectangular Integer Lattices", IEEE Trans. Communications, vol. 52, Aug. 2004, pp. 1248-1252.
Vasic, B., "High-Rate Low-Density Parity-Check Codes Based on Anti-Pasch Affine Geometries," Proc ICC 2002, pp. 1332-1336.
Weon-Cheol Lee et al., "Vitierbi Decoding Method Using Channel State Info. in COFDM System" IEEE Trans. on Consumer Elect., IEEE Service Center, NY, NY vol. 45, No. 3 Aug. 1999.
Xiao, et al "Nested Codes With Multiple Interpretations" retrieved from the Internet URL: http://www.ece.nmsu.edu/~jkliewer/paper/XFKC_CISS06 (retrieved on Dec. 5, 2012).
Yeo et al., "VLSI Architecture for Iterative Decoders in Magnetic Storage Channels", Mar. 2001, pp. 748-755, IEEE trans. Magnetics, vol. 37, No. 2.
Zhang et al., "Analysis of Verification-Based Decoding on the q-ary Symmetric Channel for Large q", IEEE Trans. on Information Theory, vol. 57, No. 10 (Oct. 2011).
Zhong et al., "Design of VLSI Implementation-Oriented LDPC Codes", IEEE, pp. 670-673, 2003.
Zhong et al., "High-Rate Quasi-Cyclic LDPC Codes for Magnetic Recording Channel with Low Error Floor", ISCAS, IEEE pp. 3546-3549, May 2006.
Zhong et al., "Joint Code-Encoder Design for LDPC Coding System VLSI Implementation", ISCAS, IEEE pp. 389-392, May 2004.
Zhong et al., "Quasi Cyclic LDPC Codes for the Magnetic Recording Channel: Code Design and VSLI Implementation", IEEE Transactions on Magnetics, v. 43, pp. 1118-1123, Mar. 2007.
Zhong, "Block-LDPC: A Practical LDPC Coding System Design Approach", IEEE Trans. on Circuits, Regular Papers, vol. 5, No. 4, pp. 766-775, Apr. 2005.

* cited by examiner

US 9,219,503 B2

SYSTEMS AND METHODS FOR MULTI-ALGORITHM CONCATENATION ENCODING AND DECODING

CROSS REFERENCE TO RELATED APPLICATIONS

The present application claims priority to (is a non-provisional of) U.S. Pat. App. No. 61/891,559 entitled "Systems and Methods for Multi-Algorithm Concatenation Encoding and Decoding", and filed Oct. 16, 2013 by Li et al. The entirety of the aforementioned provisional patent application is incorporated herein by reference for all purposes.

FIELD OF THE INVENTION

Systems and method relating generally to data processing, and more particularly to systems and methods for encoding and decoding information.

BACKGROUND

Data transfers often include encoding of a data set to be transferred to yield an encoded data set, and subsequent decoding of the encoded data set to recover the original data set. The encoding typically includes the addition of information that are designed to aid in recovering data transferred via a potentially lossy medium. In some cases, the encoding and decoding fails to provide sufficient aid in recovering a transferred data set and/or wastes bandwidth by adding too much information to aid in the recovery.

Hence, for at least the aforementioned reasons, there exists a need in the art for advanced systems and methods for data processing.

SUMMARY

Systems and method relating generally to data processing, and more particularly to systems and methods for encoding and decoding information.

Some embodiments of the present invention provide data processing systems that include a multi-algorithm data encoder circuit. The multi-algorithm data encoder circuit is operable to: apply a first algorithm encoding on a first section by section basis to a user data set yield an encoded portion; and apply a second algorithm encoding on a second section by section basis to a data set derived from a subset of the encoded portion.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phases do not necessarily refer to the same embodiment. Many other embodiments of the invention will become more fully apparent from the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

DETAILED DESCRIPTION OF SOME EMBODIMENTS

Figure 1:
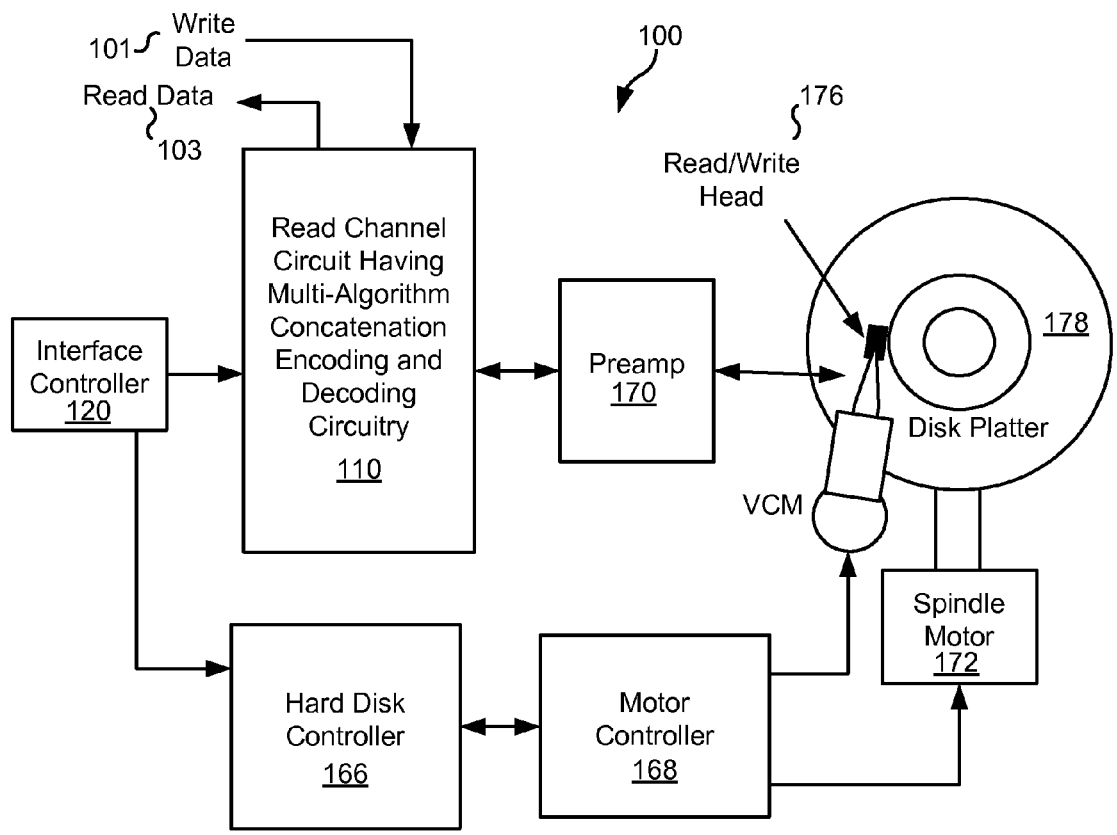
FIG. 1 shows a storage system including a read channel having multi-algorithm concatenation encoding and decoding circuitry in accordance with one or more embodiments of the present invention.

Systems and method relating generally to data processing, and more particularly to systems and methods for encoding and decoding information.

Some embodiments of the present invention provide data processing systems that include a multi-algorithm data encoder circuit and a multi-algorithm data decoder circuit. The multi-algorithm data encoder circuit is operable to: receive a user data set that includes a first data portion and a second data portion; apply a first level of a first algorithm encoding on a first section by section basis to the first data portion to yield a first encoding data, where the first encoding data includes a first encoded portion, a second encoded portion, and a third encoded portion; XOR the first encoded portion with the second user data set to yield a modified parity block; apply a second algorithm encoding on a second section by section basis to the modified parity block to yield a fourth encoded portion; apply a second level of the first encoding algorithm on the fourth encoded portion and the modified parity block to yield a fifth encoded portion; and XOR the first encoded portion, the second encoded portion, and the third encoded portion with a combination of the modified parity block, the fourth encoded portion, and the fifth encoded portion to yield an encoded data set. The multi-algorithm data decoder circuit is operable to: apply a first level of a first algorithm decoding on the first section by section basis to the encoded data set to yield a first decoded data set; apply a second level of the first algorithm encoding to at least one section of the first decoded data set to yield the first encoded portion and the second encoded portion; XOR the first encoded portion with the second data portion of the at least one section of the first decoded data set to yield a second decoded data set; apply erasure decoding to the first decoded data set modified by the second decoded data set to recover at least one other section of the first decoded data set to yield a third decoded data set; apply the second level of the first encoding algorithm to a portion of the third decoded data set to yield a fourth decoded data set; generate a strong codeword for each of the at least one section of the first decoded data set and the at least one other section of the first decoded data set; apply a second level of the first algorithm decoding to the generated strong codewords to yield the first user data portion; and generate the second user data portion based at least in part on the first user data portion.

In some instances of the aforementioned embodiments, the first algorithm encoding is a low density parity check encoding, and the second algorithm encoding is a Reed Solomon encoding. In various instances of the aforementioned embodiments, the first level of the first algorithm encoding is a strong low density parity check encoding, and the second level of the first algorithm encoding is a medium low density parity check encoding. In one or more instances of the aforementioned embodiments, the first algorithm decoding is a low density parity check decoding, and the second algorithm decoding is a Reed Solomon decoding. In some instances of the aforementioned embodiments, the first level of the first algorithm decoding is a medium low density parity check decoding, and the second level of the first algorithm encoding is a strong low density parity check decoding. In various instances of the aforementioned embodiments, the first section by section basis is a row by row basis, and the second section by section basis is a column by column basis. In some cases, the system is implemented as an integrated circuit. In various cases, the data processing system is incorporated in a storage device. In some such cases, the storage device is a hard disk drive. In other such cases, the storage device is a solid state drive.

Other embodiments of the present invention provide data processing systems that include a multi-algorithm data encoder circuit. The multi-algorithm data encoder circuit is operable to: apply a first algorithm encoding on a first section by section basis to a user data set yield an encoded portion; and apply a second algorithm encoding on a second section by section basis to a data set derived from a subset of the encoded portion. In some instances of the aforementioned embodiments, the first algorithm encoding is a low density parity check encoding, and the second algorithm encoding is a Reed Solomon encoding. In one or more cases, the first section by section basis is a row by row basis, and the second section by section basis is a column by column basis. In some cases, the system is implemented as an integrated circuit. In various cases, the data processing system is incorporated in, for example, a storage device, or a data transmission device.

In various instances of the aforementioned embodiments where the user data set is a first data portion, applying the first algorithm encoding on the first section by section basis to the first user data set to yield the encoded portion is applying a first level of the first algorithm encoding on the first section by section basis to the first data portion to yield a first encoding data, wherein the first encoding data includes a first encoded portion, a second encoded portion, and a third encoded portion. In such instances, the multi-algorithm data encoder circuit is further operable to: exclusive OR (XOR) the first encoded portion with the second user data set to yield a modified parity block. Applying the second algorithm encoding on the second section by section basis to the data set derived from the subset of the encoded portion includes applying the second algorithm encoding on the second section by section basis to the modified parity block to yield a fourth encoded portion. In some cases, the multi-algorithm data encoder circuit is further operable to: apply a second level of the first encoding algorithm on the fourth encoded portion and the modified parity block to yield a fifth encoded portion; and XOR the first encoded portion, the second encoded portion, and the third encoded portion with a combination of the modified parity block, the fourth encoded portion, and the fifth encoded portion to yield an encoded data set. In particular cases, the first level of the first algorithm encoding is a strong low density parity check encoding, and the second level of the first algorithm encoding is a medium low density parity check encoding.

Yet other embodiments of the present invention provide data processing systems that include a multi-algorithm data decoder circuit. The multi-algorithm data decoder circuit is operable to: apply a first level of a first algorithm decoding on the first section by section basis to the encoded data set to yield a first decoded data set; apply a second level of the first algorithm encoding to at least one section of the first decoded data set to yield the first encoded portion and the second encoded portion; XOR the first encoded portion with the second data portion of the at least one section of the first decoded data set to yield a second decoded data set; apply erasure decoding to the first decoded data set modified by the second decoded data set to recover at least one other section of the first decoded data set to yield a third decoded data set; apply the second level of the first encoding algorithm to a portion of the third decoded data set to yield a fourth decoded data set; generate a strong codeword for each of the at least one section of the first decoded data set and the at least one other section of the first decoded data set; apply a second level of the first algorithm decoding to the generated strong codewords to yield the first user data portion; and generate the second user data portion based at least in part on the first user data portion.

In various cases, a data processing circuit is included that includes a data detector circuit and a data decoder circuit. The data detector circuit is operable to apply a data detection algorithm to a codeword to yield a detected output, and the data decoder circuit is operable to apply a data decode algorithm to a decoder input derived from the detected output to yield a decoded output. Processing a codeword through both the data detector circuit and the data decoder circuit is generally referred to as a "global iteration". During a global iteration, the data decode algorithm may be repeated applied. Each application of the data decode algorithm during a given global iteration is referred to as a "local iteration".

Turning to FIG. 1, a storage system 100 is shown that includes a read channel 110 having multi-algorithm concatenation encoding and decoding circuitry in accordance with one or more embodiments of the present invention. Storage system 100 may be, for example, a hard disk drive. Storage system 100 also includes a preamplifier 170, an interface controller 120, a hard disk controller 166, a motor controller 168, a spindle motor 172, a disk platter 178, and a read/write head 176. Interface controller 120 controls addressing and timing of data to/from disk platter 178, and interacts with a host controller (not shown). The data on disk platter 178 consists of groups of magnetic signals that may be detected by read/write head assembly 176 when the assembly is properly positioned over disk platter 178. In one embodiment, disk platter 178 includes magnetic signals recorded in accordance with either a longitudinal or a perpendicular recording scheme.

In a typical read operation, read/write head 176 is accurately positioned by motor controller 168 over a desired data track on disk platter 178. Motor controller 168 both positions read/write head 176 in relation to disk platter 178 and drives spindle motor 172 by moving read/write head assembly 176 to the proper data track on disk platter 178 under the direction of hard disk controller 166. Spindle motor 172 spins disk platter 178 at a determined spin rate (RPMs). Once read/write head 176 is positioned adjacent the proper data track, magnetic signals representing data on disk platter 178 are sensed by read/write head 176 as disk platter 178 is rotated by spindle motor 172. The sensed magnetic signals are provided as a continuous, minute analog signal representative of the magnetic data on disk platter 178. This minute analog signal is transferred from read/write head 176 to read channel circuit 110 via preamplifier 170. Preamplifier 170 is operable to amplify the minute analog signals accessed from disk platter 178. In turn, read channel circuit 110 decodes and digitizes the received analog signal to recreate the information originally written to disk platter 178. This data is provided as read data 103 to a receiving circuit. A write operation is substantially the opposite of the preceding read operation with write data 101 being provided to read channel circuit 110. This data is then encoded and written to disk platter 178.

In operation, data written to disk platter 178 is encoded using multi-algorithm concatenation encoding to yield encoded data sets. The encoding may be done by a circuit similar to that discussed below in relation to FIG. 5, and/or may be performed consistent with a process discussed below in relation to FIG. 7. The data accessed from disk platter 178 is decoded using a multi-algorithm decoding process. In some cases, the decoding may be done by a circuit similar to that discussed below in relation to FIG. 6, and/or may be performed similar to the process discussed below in relation to FIG. 8.

It should be noted that storage system 100 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such as storage system 100, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

A data decoder circuit used in relation to read channel circuit 110 may be, but is not limited to, a low density parity check (LDPC) decoder circuit as are known in the art. Such low density parity check technology is applicable to transmission of information over virtually any channel or storage of information on virtually any media. Transmission applications include, but are not limited to, optical fiber, radio frequency channels, wired or wireless local area networks, digital subscriber line technologies, wireless cellular, Ethernet over any medium such as copper or optical fiber, cable channels such as cable television, and Earth-satellite communications. Storage applications include, but are not limited to, hard disk drives, compact disks, digital video disks, magnetic tapes and memory devices such as DRAM, NAND flash, NOR flash, other non-volatile memories and solid state drives.

In addition, it should be noted that storage system 100 may be modified to include solid state memory that is used to store data in addition to the storage offered by disk platter 178. This solid state memory may be used in parallel to disk platter 178 to provide additional storage. In such a case, the solid state memory receives and provides information directly to read channel circuit 110. Alternatively, the solid state memory may be used as a cache where it offers faster access time than that offered by disk platter 178. In such a case, the solid state memory may be disposed between interface controller 120 and read channel circuit 110 where it operates as a pass through to disk platter 178 when requested data is not available in the solid state memory or when the solid state memory does not have sufficient storage to hold a newly written data set. Based upon the disclosure provided herein, one of ordinary skill in the art will recognize a variety of storage systems including both disk platter 178 and a solid state memory.

Figure 2:
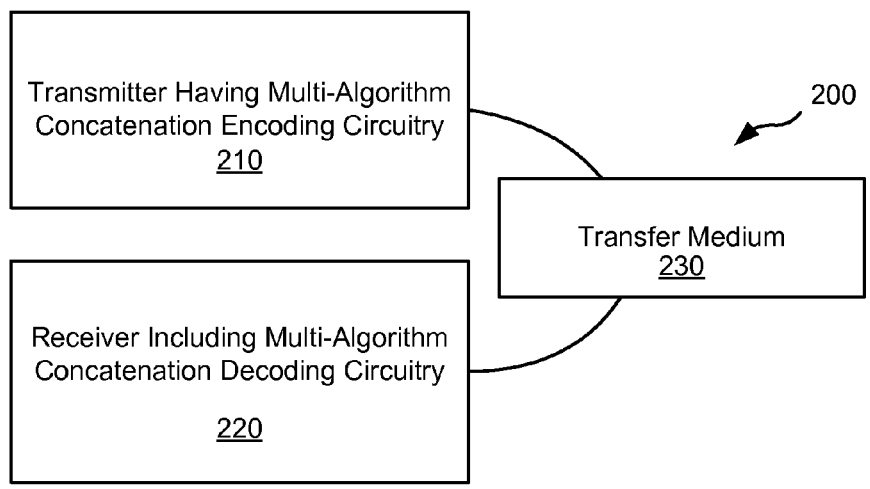
FIG. 2 shows a data transmission system including a transmitter having multi-algorithm concatenation encoding and a receiver including multi-algorithm concatenation decoding circuitry in accordance with one or more embodiments of the present invention.

Turning to FIG. 2, a data transmission system 200 including a transmitter 210 having two step concatenation encoding yielding equal payloads and a receiver 220 including three step decoding circuitry in accordance with one or more embodiments of the present invention. Transmitter 210 transmits encoded data via a transfer medium 230 as is known in the art. The encoded data is received from transfer medium 230 by receiver 220.

During operation, data is received by transmitter 210 where it is encoded. The encoding is a two step encoding that may be performed using a circuit similar to that discussed below in relation to FIG. 6, and/or may be performed consistent with a process discussed below in relation to FIG. 8. The data received via transfer medium 230 is decoded using a three step decoding process. In some cases, the decoding may be done by a circuit similar to that discussed below in relation to FIG. 5, and/or may be performed similar to the process discussed below in relation to FIG. 7.

Figure 3:
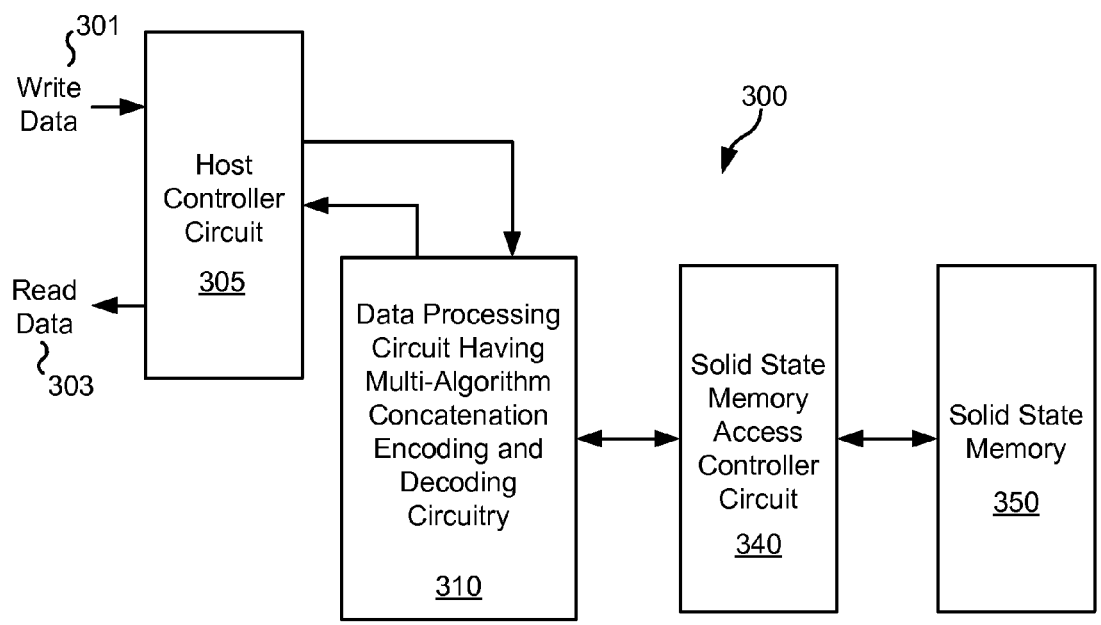
FIG. 3 shows another storage system including a data processing circuit having multi-algorithm concatenation encoding and decoding circuitry in accordance with one or more embodiments of the present invention.

Turning to FIG. 3, another storage system 300 is shown that includes a data processing circuit 310 having multi-algorithm concatenation encoding and decoding circuitry in accordance with one or more embodiments of the present invention. A host controller circuit 305 receives data to be stored (i.e., write data 301). This data is provided to data processing circuit 310 where it is encoded using a two step encoding yielding equal payloads. The encoding may be done by a circuit similar to that discussed below in relation to FIG. 5, and/or may be performed consistent with a process discussed below in relation to FIG. 7. The encoded data is provided to a solid state memory access controller circuit 340. Solid state memory access controller circuit 340 may be any circuit known in the art that is capable of controlling access to and from a solid state memory. Solid state memory access controller circuit 340 formats the received encoded data for transfer to a solid state memory 350. Solid state memory 350 may be any solid state memory known in the art. In some embodiments of the present invention, solid state memory 350 is a flash memory. Later, when the previously written data is to be accessed from solid state memory 350, solid state memory access controller circuit 340 requests the data from solid state memory 350 and provides the requested data to data processing circuit 310. In turn, data processing circuit 310 decodes the received data and provides the decoded data to host controller circuit 305 where it is passed on as read data 303. In some cases, the decoding may be done by a circuit similar to that discussed below in relation to FIG. 6, and/or may be performed similar to the process discussed below in relation to FIG. 8.

Figure 4A:
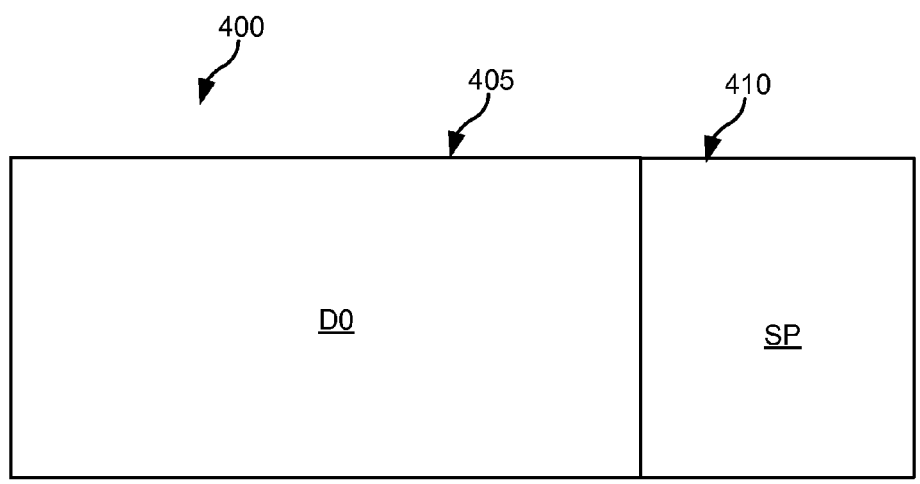
FIGS. 4a-4g are graphical depictions of user data encoding using multi-algorithm concatenation encoding in accordance with one or more embodiments of the present invention.

Turning to FIG. 4a, a graphical depiction of a data set 400 that includes a number of rows of a first user data set (D0) 405 encoded on a row by row basis using a strong low density parity check (LDPC) algorithm to yield a corresponding number of rows of strong parity (SP) 410. As used herein the term "strong" encoding refers to an encoding that results in more encoding data than that achieved through use of, for example, "medium" or "weak" encoding. Similarly, as used herein the term "medium" encoding refers to an encoding that results in more encoding data than that achieved through use of "weak" encoding and fewer encoding data than that achieved through use of "strong" encoding; and as used herein the term "weak" encoding refers to an encoding that results in fewer encoding data than that achieved through use of "medium" or "strong" encoding.

Figure 4B:
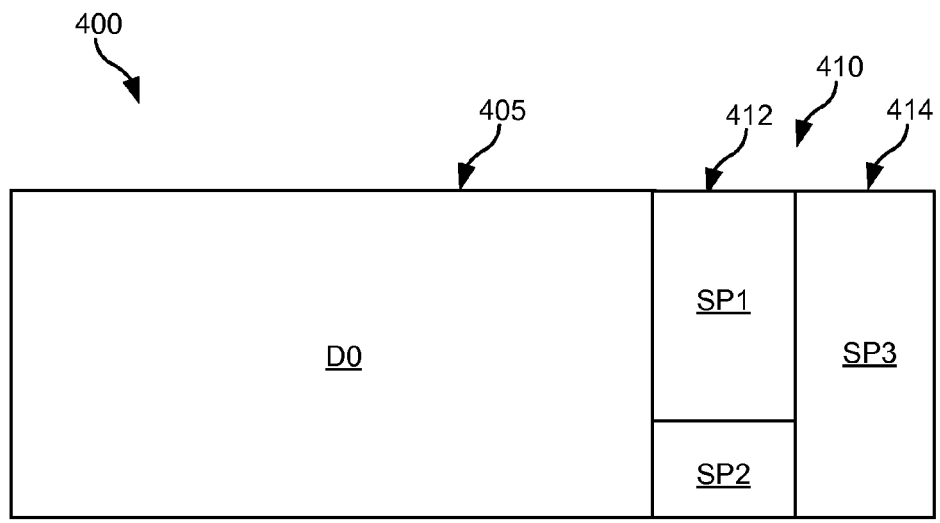

Turning to FIG. 4b, data set 400 of FIG. 4a is shown with strong parity (SP) 410 separated into three distinct regions (a first strong parity region (SP1), a second strong parity region (SP2), and a third strong parity region (SP3)) for explanation purposes. To be clear, SP1 is a portion of (SP) corresponding to the outlined area, SP2 is a portion of (SP) corresponding to the outlined area, and SP3 is a portion of (SP) corresponding to the outlined area. First strong parity region (SP1) and second strong parity region (SP2) cover a first set of columns 412 of SP 410, and SP3 covers a second set of columns 414 of SP 410.

Figure 4C:
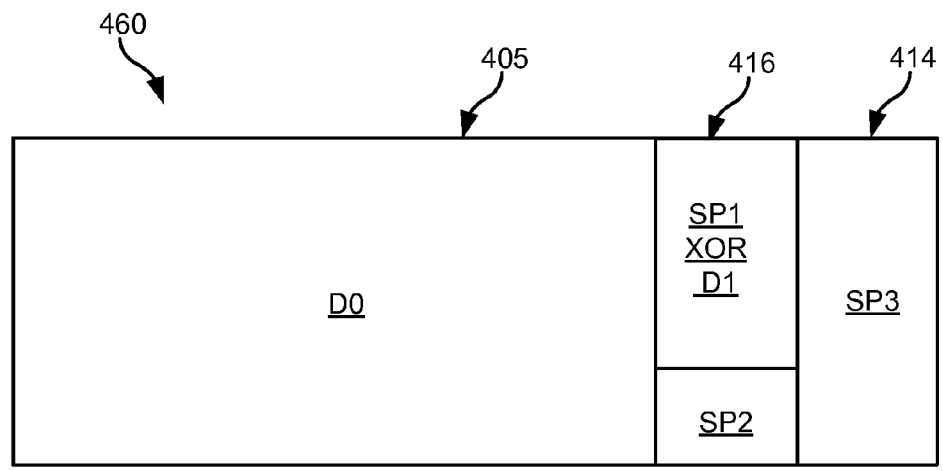
Figure 4D:
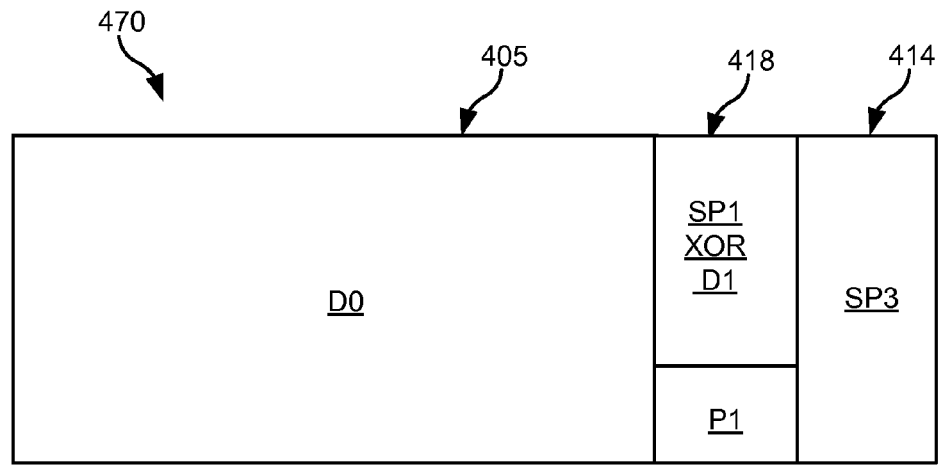
Figure 4E:
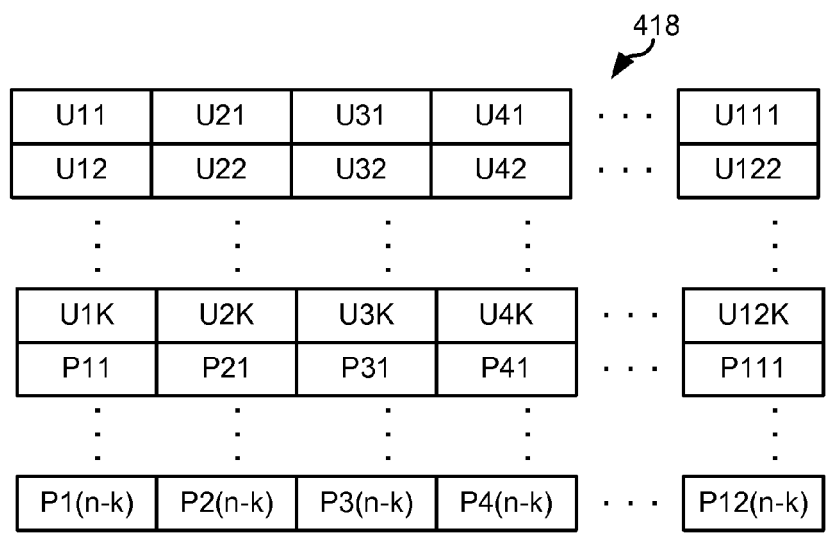

Turning to FIG. 4c, a data set 460 is shown where first strong parity region (SP1) of the first set of columns 412 is XORed with a second user data set (D1) to yield an updated first set of columns 416. Turning to FIG. 4d, a data set 470 is shown where Reed Solomon encoding is applied to the SP1 XOR D1 data of the updated first set of columns 416 to yield parity data (P1) that is used to replace the second strong parity (SP2) of the updated first set of columns 416. The updated parity data (P1) is included in updated first set of columns 416 to yield an updated first set of columns 418. FIG. 4e shows the detail on the column by column Reed Solomon encoding of the updated first set of columns 418. As shown, a first column of the updated first set of columns 418 includes a number of syndromes (U11, U12 . . . U1K) corresponding to respective rows. Each of the columns includes syndromes until the last column that includes syndromes U111, U122 . . . U12k. In some embodiments of the present invention, the syndromes may be accumulated across the rows such that the syndrome U1k is an accumulation of all of the syndromes from the first column from U11 to U1K. Similarly, the syndrome U12 is an accumulation of the syndrome U11 and U12. This accumulation process is repeated on a column by column basis such that the last syndrome in the respective column is an accumulation of the prior accumulations in the column. By using such an accumulation approach, no extra buffer to hold the syndromes is required. After the last syndrome (U12k) is received, the parities included in parity data (P1) (i.e., P11 . . . P12(n–k)) are calculated on a column by column basis.

Figure 4F:
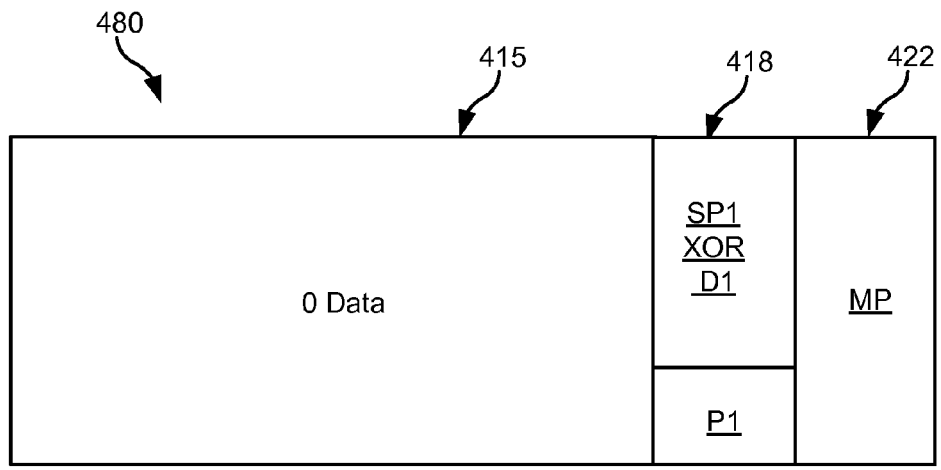
Figure 4G:
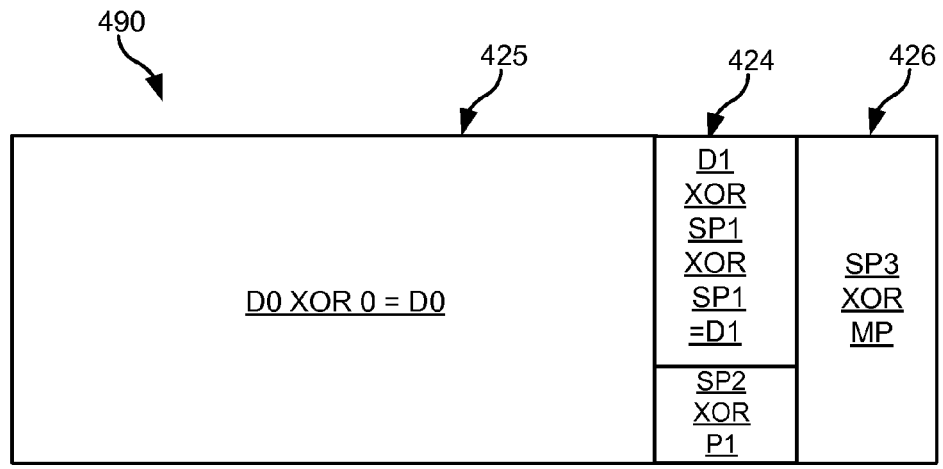

Next, as shown in FIG. 4f, a data set 480 is shown with first user data set (D0) 405 zeroed out to yield a zero data set 415. Medium LDPC encoding is applied on a row by row basis to generate a medium parity (MP) that becomes an updated second set of columns 422 in place of third strong parity (SP3). Next, as shown in FIG. 4g, the prior elements (i.e., data set 400) are XORed with data set 480 to yield a data set 490. As shown, first user data set (D0) 405 is XORed with the zero data set 415 to yield a regenerated first user data set (D0) 425. SP1 XOR D1 is XORed with SP1 to yield D1 and P1 is XORed with SP2 to yield SP2 XOR P1. Both of the aforementioned are included in an updated first set of columns 424. SP3 is XORed with MP to yield SP3 XOR MP that is included in a second updated set of columns 426. Data set 490 is then transferred via a medium.

Figure 5:
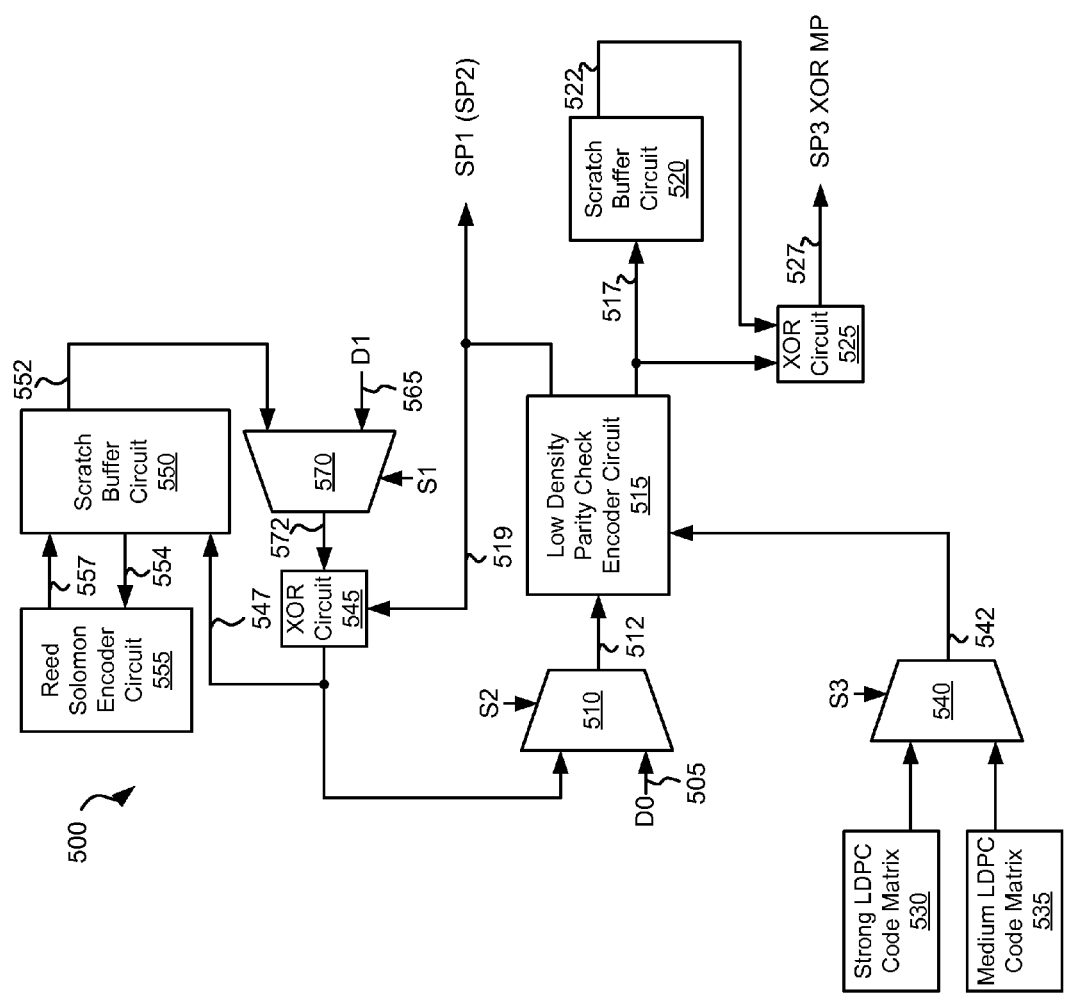
FIG. 5 depicts a multi-algorithm data encoding circuit accordance with various embodiments of the present invention.

Turning to FIG. 5, a multi-algorithm data encoding circuit 500 is shown accordance with various embodiments of the present invention. As shown, multi-algorithm data encoding circuit 500 includes a data selector circuit 510 that selects one of an XORed value 547 or a first user data set (D0) 505 as a selected output 512 based upon a selection value (S2). Selected output 512 is provided to a low density parity check encoder circuit 515.

Low density parity check encoder circuit 515 is operable to apply a selected low density parity check algorithm to selected output 512 to yield a parity output 519 that includes a first strong parity (SP1) and a second strong parity (SP2) and a parity output 517 that includes a medium parity (MP) and a third strong parity (SP3). The selected low density parity check algorithm is selected based upon a selection value (S3) applied to a selector circuit 540. In particular, selector circuit 540 selects one of a strong LDPC code matrix 530 or a medium LDPC code matrix 535 as a selected output 542. Selected output 542 is provided to low density parity check encoder circuit 515 to determine whether low density parity check encoder circuit 515 applies either a medium LDPC algorithm or a strong LDPC algorithm. Parity output 517 is provided to a scratch buffer circuit 520 and to an XOR circuit 525. XOR circuit 525 XORs an output 522 from scratch buffer circuit 520 and parity output 517 to yield an XOR output 527 (i.e., SP3 XOR MP).

Parity output 519 is provided to XOR circuit 545 where it is XORed with a selected output 572 to yield XORed value 547. Selected output 572 is selected by a selector circuit 570 to be either a second user data set (D1) 565 or a buffered output 552 depending upon a selection value (S1). A scratch buffer circuit 550 stores one of XORed value 547 or a Reed Solomon output 557. A Reed Solomon encoder circuit 555 applies a Reed Solomon encoding algorithm to a buffered output 554 to yield Reed Solomon output 557.

In operation, selection value (S2) is set to select first user data set (D0) 505 as selected output 512, selection value (S3) is set to select strong LDPC code matrix 530 as selected output 542, and selection value (S1) is set to select second user data (D1) 565 as selected output 572. With these selections, low density parity check encoder circuit 515 applies strong LDPC encoding to first user data set (D0) 505 on a row by row basis to yield SP1, SP2 and SP3. An example of the data set at this juncture is shown in FIG. 4b that was previously described. Parity output 517 including SP3 is stored to scratch buffer circuit 520. The SP1 portion of parity output 519 is XORed with selected output 572 that is second user data (D1) 565 to yield (SP1 XOR D1). An example of the data set at this juncture is shown in FIG. 4c that was previously described. Additionally, XORed value 547 (i.e., D1 XOR SP1) is stored to scratch buffer circuit 550. This value is provided to Reed Solomon encoder circuit 555 as buffered output 554 where Reed Solomon encoding is applied on a column by column basis to yield a parity output (P) as Reed Solomon output 557. Reed Solomon output 557 is stored to scratch buffer circuit 550. An example of the data set at this juncture is shown in FIG. 4d that was previously described.

Selection value (S2) is set to select XORed value 547 as selected output 512, selection value (S3) is set to select medium LDPC code matrix 535 as selected output 542, and selection value (S1) is set to select parity data (P1) as selected output 572. Low density parity check encoder circuit 515 applies a medium low density parity check encoding algorithm to XORed output 547 (SP1 XOR D1) and parity data (P1) to yield medium parity (MP). An example of the data set at this juncture is shown in FIG. 4f that was previously described. Selection value (S2) is set to select first user data (D0) 505 as selected output 512, selection value (S3) is set to select medium LDPC code matrix 535 as selected output 542, and selection value (S1) is set to select parity data (P1) as selected output 572. The various results are then XORed such that D0, D1, (SP2 XOR P1) and (SP3 XOR MP) using SP3 available as buffered output 522 XORed with parity output 517. An example of the data set at this juncture is shown in FIG. 4g that was previously described.

Figure 6:
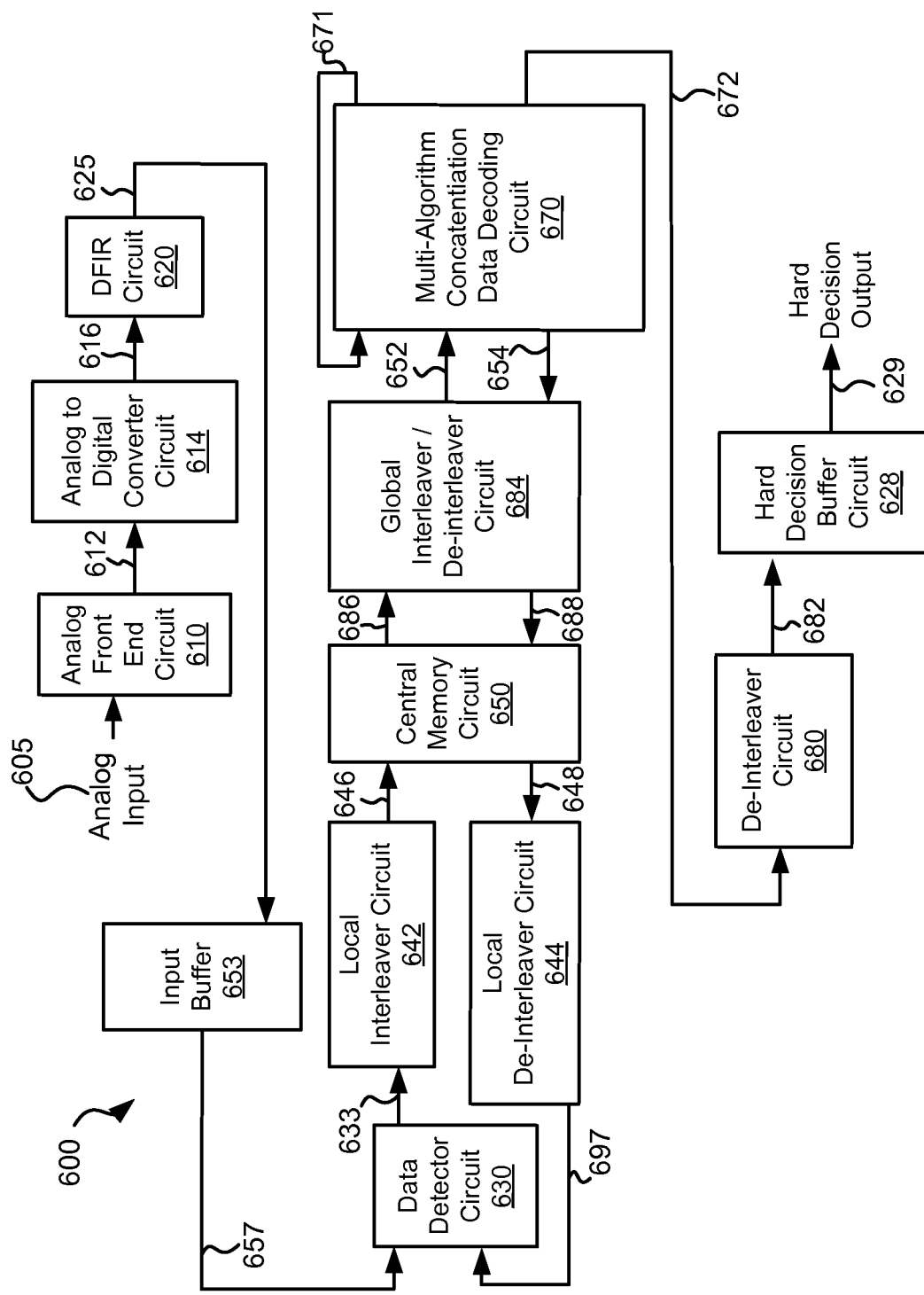
FIG. 6 depicts a data processing system including a multi-algorithm concatenation decoding circuit in accordance with some embodiments of the present invention.

Turning to FIG. 6, a data processing system 600 including a multi-algorithm concatenation decoding circuit 670 in accordance with some embodiments of the present invention. Data processing system 600 includes an analog front end circuit 610 that receives an analog signal 605. Analog front end circuit 610 processes analog signal 605 and provides a processed analog signal 612 to an analog to digital converter circuit 614. Analog front end circuit 610 may include, but is not limited to, an analog filter and an amplifier circuit as are known in the art. Based upon the disclosure provided herein, one of ordinary skill in the art will recognize a variety of circuitry that may be included as part of analog front end circuit 610. In some cases, analog signal 605 is derived from a read/write head assembly (not shown) that is disposed in relation to a storage medium (not shown). In other cases, analog signal 605 is derived from a receiver circuit (not shown) that is operable to receive a signal from a transmission medium (not shown). The transmission medium may be wired or wireless. Based upon the disclosure provided herein, one of ordinary skill in the art will recognize a variety of source from which analog input 605 may be derived.

Analog to digital converter circuit 614 converts processed analog signal 612 into a corresponding series of digital samples 616. Analog to digital converter circuit 614 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention. Digital samples 616 are provided to an equalizer circuit 620. Equalizer circuit 620 applies an equalization algorithm to digital samples 616 to yield an equalized output 625. In some embodiments of the present invention, equalizer circuit 620 is a digital finite impulse response filter circuit as are known in the art. It may be possible that equalized output 625 may be received directly from a storage device in, for example, a solid state storage system. In such cases, analog front end circuit 610, analog to digital converter circuit 614 and equalizer circuit 620 may be eliminated where the data is received as a digital data input. Equalized output 625 is stored to an input buffer 653 that includes sufficient memory to maintain a number of codewords until processing of that codeword is completed through a data detector circuit 630 and multi-algorithm concatenation decoding circuit 670 including, where warranted, multiple global iterations (passes through both data detector circuit 630 and multi-algorithm concatenation decoding circuit 670) and/or local iterations (passes through multi-algorithm concatenation decoding circuit 670 during a given global iteration). An output 657 is provided to data detector circuit 630.

Data detector circuit 630 may be a single data detector circuit or may be two or more data detector circuits operating in parallel on different codewords. Whether it is a single data detector circuit or a number of data detector circuits operating in parallel, data detector circuit 630 is operable to apply a data detection algorithm to a received codeword or data set. In some embodiments of the present invention, data detector circuit 630 is a Viterbi algorithm data detector circuit as are known in the art. In other embodiments of the present invention, data detector circuit 630 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. In some cases, one data detector circuit included in data detector circuit 630 is used to apply the data detection algorithm to the received codeword for a first global iteration applied to the received codeword, and another data detector circuit included in data detector circuit 630 is operable apply the data detection algorithm to the received codeword guided by a decoded output accessed from a central memory circuit 650 on subsequent global iterations.

Upon completion of application of the data detection algorithm to the received codeword on the first global iteration, data detector circuit 630 provides a detector output 633. Detector output 633 includes soft data. As used herein, the phrase "soft data" is used in its broadest sense to mean reliability data with each instance of the reliability data indicating a likelihood that a corresponding bit position or group of bit positions has been correctly detected. In some embodiments of the present invention, the soft data or reliability data is log likelihood ratio data as is known in the art. Detector output 633 is provided to a local interleaver circuit 642. Local interleaver circuit 642 is operable to shuffle sub-portions (i.e., local chunks) of the data set included as detected output and provides an interleaved codeword 646 that is stored to central memory circuit 650. Interleaver circuit 642 may be any circuit known in the art that is capable of shuffling data sets to yield a re-arranged data set. Interleaved codeword 646 is stored to central memory circuit 650.

Once multi-algorithm concatenation decoding circuit 670 is available, a previously stored interleaved codeword 646 is accessed from central memory circuit 650 as a stored codeword 686 and globally interleaved by a global interleaver/de-interleaver circuit 684. Global interleaver/de-interleaver circuit 684 may be any circuit known in the art that is capable of globally rearranging codewords. Global interleaver/De-interleaver circuit 684 provides a decoder input 652 into multi-algorithm concatenation decoding circuit 670. Decoder output 652 may encoded similar to that discussed above in relation to FIGS. 4a-4g including distribution of encoding data to an encoded output similar to that depicted above in relation to FIG. 4g. In some embodiments of the present invention, the data decode algorithm is a low density parity check algorithm as are known in the art. Based upon the disclosure provided herein, one of ordinary skill in the art will recognize other decode algorithms that may be used in relation to different embodiments of the present invention. Multi-algorithm concatenation decoding circuit 670 applies a data decode algorithm to decoder input 652 to yield a decoded output 671. In cases where another local iteration (i.e., another pass trough data decoder circuit 670) is desired, multi-algorithm concatenation decoding circuit 670 re-applies the data decode algorithm to decoder input 652 guided by decoded output 671. This continues until either a maximum number of local iterations is exceeded or decoded output 671 converges (i.e., completion of standard processing).

Where decoded output 671 fails to converge (i.e., fails to yield the originally written data set) and a number of local iterations through multi-algorithm concatenation decoding circuit 670 exceeds a threshold, the resulting decoded output is provided as a decoded output 654 back to central memory circuit 650 where it is stored awaiting another global iteration through a data detector circuit included in data detector circuit 630. Prior to storage of decoded output 654 to central memory circuit 650, decoded output 654 is globally de-interleaved to yield a globally de-interleaved output 688 that is stored to central memory circuit 650. The global de-interleaving reverses the global interleaving earlier applied to stored codeword 686 to yield decoder input 652. When a data detector circuit included in data detector circuit 630 becomes available, a previously stored de-interleaved output 688 is accessed from central memory circuit 650 and locally de-interleaved by a de-interleaver circuit 644. De-interleaver circuit 644 re-arranges decoder output 648 to reverse the shuffling originally performed by interleaver circuit 642. A resulting de-interleaved output 697 is provided to data detector circuit 630 where it is used to guide subsequent detection of a corresponding data set previously received as equalized output 625.

Alternatively, where the decoded output converges (i.e., yields the originally written data set), the resulting decoded output is provided as an output codeword 672 to a de-interleaver circuit 680 that rearranges the data to reverse both the global and local interleaving applied to the data to yield a de-interleaved output 682. De-interleaved output 682 is provided to a hard decision buffer circuit 628 buffers de-interleaved output 682 as it is transferred to the requesting host as a hard decision output 629.

In operation, an encoded data set (e.g., a data set similar to that discussed above in relation to FIG. 4g) is processed through analog front end circuit 610, analog to digital converting circuit 614, equalizer circuit 620 and data detector circuit 630 with a derivative of the result being stored to central memory circuit 650. Central memory circuit 650 is then accessed to obtain decoder input 652 that is provide to multi-algorithm concatenation decoding circuit 670. A first row of decoder input 652 is accessed and medium LDPC decoding is applied to the first row. It is determined whether decoding of the first row converged (e.g., resulted in no remaining parity check errors). Where the decoding converged, the converged row is stored. Otherwise, where decoding of the first row failed to converge, a non-converged row count is incremented. This process is repeated for each of the rows in decoder input 652.

It is then determined whether the number of non-converged rows exceed a number of rows that can be corrected using concatenation decoding. Where the number of non-converged rows is greater than that which can be corrected using concatenation decoding, standard retry processing is applied in an attempt to recover the data in decoder input 652. Otherwise, where the number of non-converged rows is less than or equal to that which can be corrected, concatenation decoding is applied using Reed Solomon decoding.

In the concatenation decoding, the converged rows are used to generate the first strong parity (SP1) and the second strong parity (SP2) from the first user data portion of each of the converged rows. This is done by applying the strong LDPC encoding to each of the converged rows similar to that done during the encoding process. The first strong parity (SP1) is then XORed with the second user data set (D1) from each of the converged rows to yield the corresponding Reed Solomon codes for each of the converged rows. Then, erasure decoding is applied where the non-converged rows are erased (e.g., the probability or soft data associated with the rows is lowered to indicate a low probability), and decoding is applied where the data in the converged rows is used to generate the data in the non-converged rows. This process also recovers the Reed Solomon parity (P1) included in the original encoding. The data portions are then zeroed, and the medium LDPC decoding is applied to generate the original medium parity (MP).

At this juncture, it is assumed that the received row X is Ri=[R0, R1, R3]. To the Ri vector the vector [0, SPi XOR D1i) or (SP2i XOR P1i), MPi] is XORed to yield the received strong codeword for row X (SRi). Strong LDPC decoding is applied to the SRi to yield D0i for each of the non-converged rows. Where all the rows converge, the data decoding ends. Alternatively, where the number of remaining errors is not sufficiently reduced to allow the strong decoding to converge, standard retry decoding is applied to decoder input 652. Otherwise, strong parity (SP1i) for the newly recovered first user data (D0i) is generated using the original encoding process. Strong parity (SP1i) is XORed with (SP1i XOR D1i) to recover the original D1.

Figure 7:
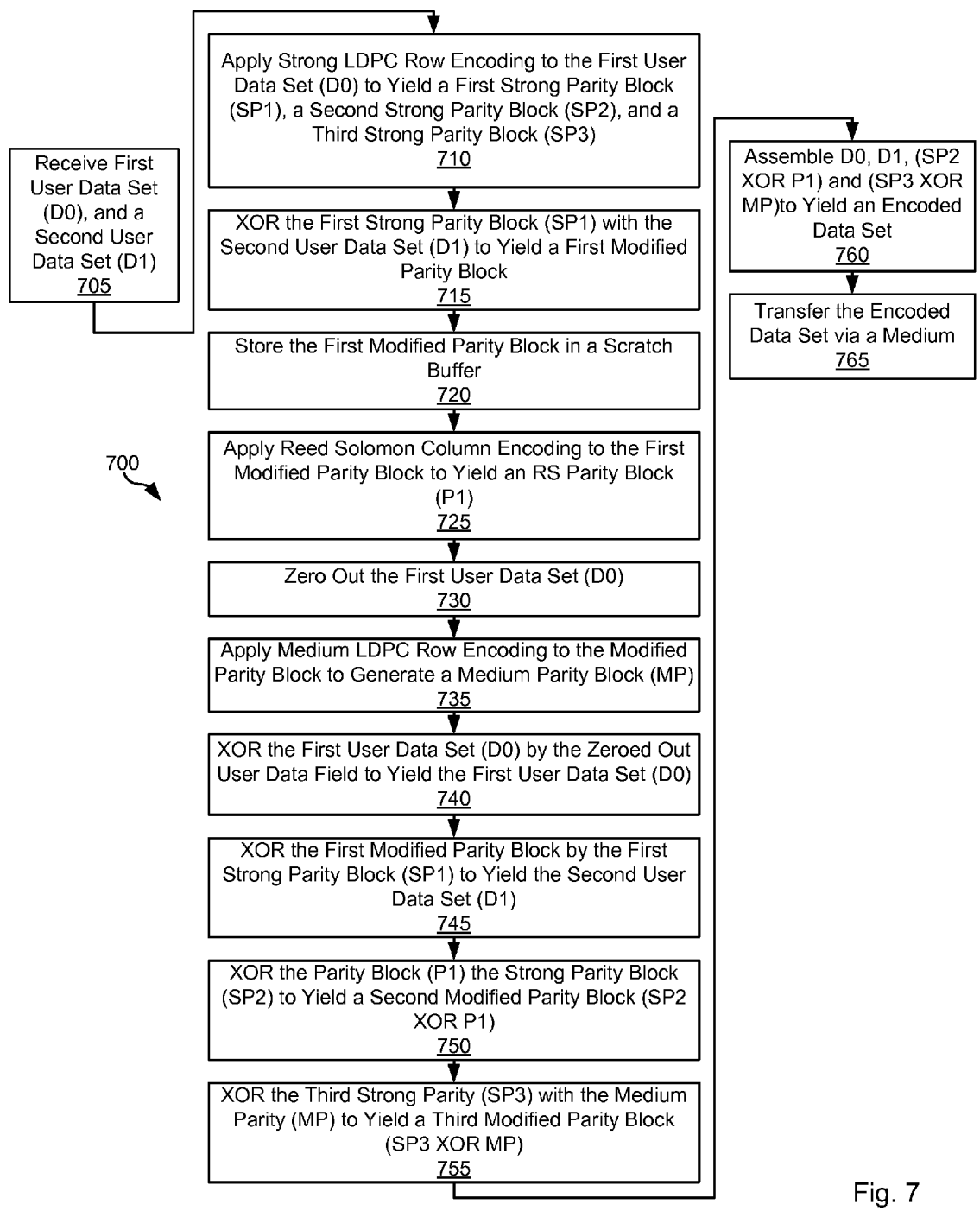
FIG. 7 is a flow diagram depicting a method for data encoding in accordance with some embodiments of the present invention.

Turning to FIG. 7, a flow diagram 700 depicts a method for data encoding in accordance with some embodiments of the present invention. Following flow diagram 700, a user data set is received (block 705). The user data set includes a first user data set D0 and a second user data set D1. Strong LDPC row encoding is applied to the first data set D0 to yield strong parity blocks (SP1, SP2, SP3) (block 710). For example, referring to data set 400 of FIG. 4b, strong LDPC encoding is applied on a row by row basis to D0 to yield strong parity (SP1, SP2, SP3). The first strong parity block (SP1) is XORed with the second user data (D1) to yield a first modified parity block (SP1 XOR D1) (block 715). As an example, referring to data set 460 of FIG. 4c, the first strong parity (SP1) is shown XORed with the second user data set (SP1 XOR D1), and the first modified parity block is stored to a scratch buffer (block 720).

Reed Solomon encoding is then applied on a column by column basis to the first modified parity block to yield an RS parity block (P1) (block 725). As an example, referring to data set 470 of FIG. 4d, the first modified parity block is processed to yield the parity block (P1). The first user data (D0) is then zeroed out (block 730) and medium low density parity encoding is applied on a row by row basis to yield medium parity (MP) (block 735). As an example, referring to data set 480 of FIG. 4e, the data set including the zeroed out first data set (D0) and the medium parity (MP).

The zeroed out data is then XORed with the first user data set (D0) to yield the first user data set (D0) (block 740), the first modified parity block is XORed with the first strong parity (SP1) to yield the second user data set (D1) (block 745), parity block (P1) is XORed with the strong parity block (SP2) to yield a second modified parity block (SP2 XOR P1) (block 750), and the third strong parity (SP3) is XORed with the medium parity (MP) to yield a third modified parity block (SP3 XOR MP) (block 755). Then, all of D0, D1, (SP2 XOR P1) and (Sp3 XOR MP) are assembled to yield an encoded data set (block 760). Referring to data set 490 of FIG. 4g, an example of an encoded data set is shown. This encoded data set is then transferred via a medium (block 765).

Figure 8:
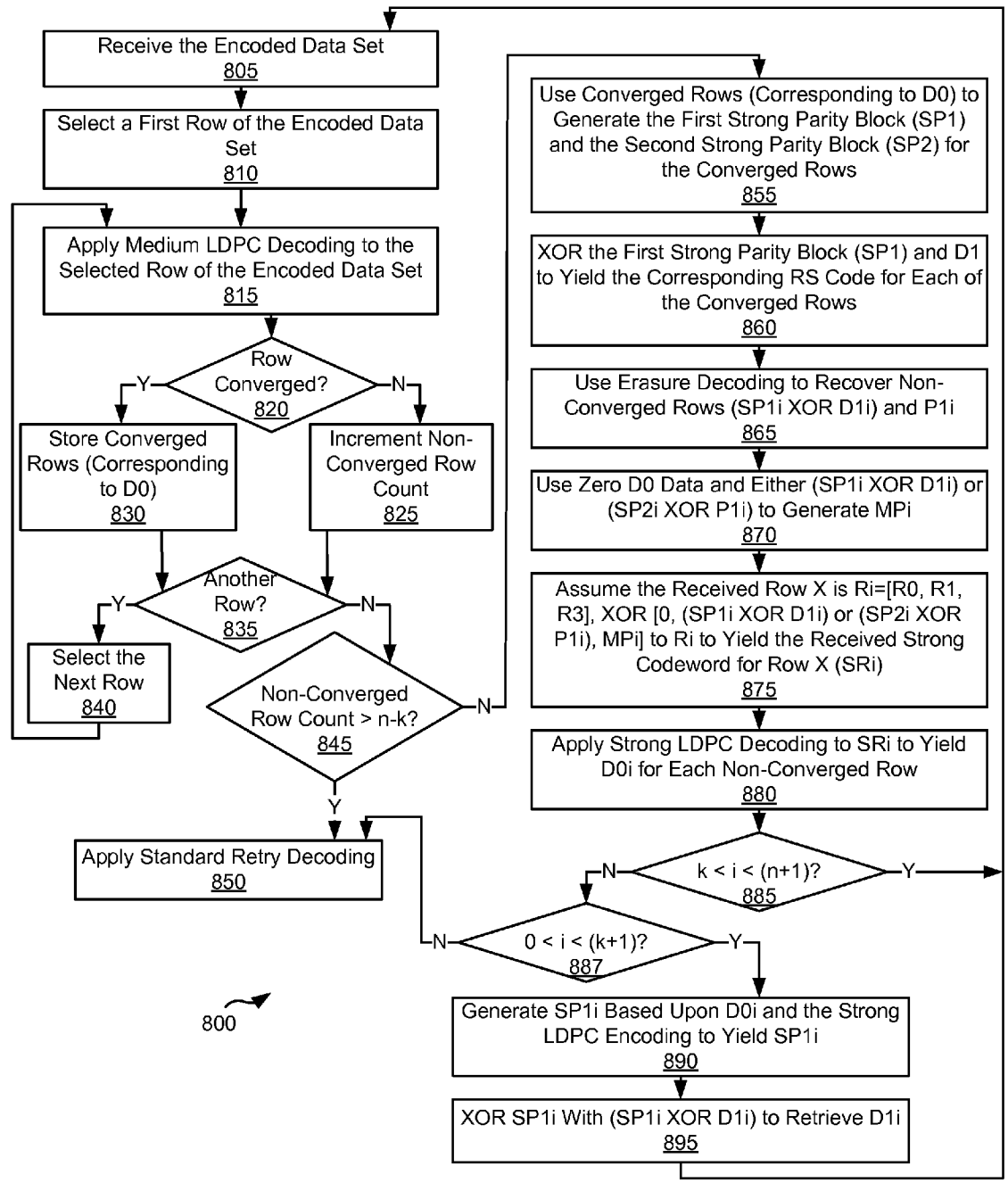
FIG. 8 is a flow diagram showing a method for data decoding in accordance with one or more embodiments of the present invention.

Turning to FIG. 8, a flow diagram 800 shows a method for data decoding in accordance with one or more embodiments of the present invention. Following flow diagram 800, an encoded data set (e.g., a data set similar to that discussed above in relation to FIG. 4g) is received (block 805). A first row of the encoded data set is selected (block 810), and medium LDPC decoding is applied to the selected row (block 815). It is determined whether decoding of the first row converged (e.g., resulted in no remaining parity check errors) (block 820). Where the decoding converged (block 820), the converged row is stored (block 830). Otherwise, where decoding of the first row failed to converge (i.e., errors remained) (block 820), a non-converged row count is incremented (block 825). It is determined whether another row remains to be decoded (block 835). Where another row remains to be decoded (block 835), the next row of the encoded data set is selected (block 840), and the processes of blocks 815-835 are repeated for the next row.

Alternatively, where another row remains to be decoded (block 835), the it is determined whether the number of non-converged rows is greater than a threshold (n–k) (block 845). The aforementioned n corresponds to the total number of rows of the first user data (D0) and k corresponds to the total number of rows of the second user data (D1). Where the number of non-converged rows is greater than the threshold (n–k) (block 845), it is not possible to correct the remaining errors using concatenation decoding. As such, standard retry decoding is applied (block 850). Such standard retry decoding performs one or more retry processes as are known in the art.

Otherwise, where the number of non-converged rows is not greater than the threshold (n–k) (block 845), concatenation decoding is performed. The concatenation decoding uses converged rows to generate the first strong parity block (SP1) and the second strong parity block (SP2) for each of the converged rows (block 855). The strong parity blocks are generated by applying strong LDPC encoding similar to that discussed above in relation to block 710 of FIG. 7. The first strong parity (SP1) is then XORed with the second user data set (D1) from each of the converged rows to yield the corresponding Reed Solomon codes for each of the converged rows (block 860). Then, erasure decoding is applied where the non-converged rows are erased (e.g., the probability or soft data associated with the rows is lowered to indicate a low probability), and decoding is applied where the data in the converged rows is used to generate the data in the non-converged rows (bock 865). This process also recovers the Reed Solomon parity (P1) included in the original encoding. The data portions are then zeroed, and the medium LDPC decoding is applied to generate the original medium parity (MP) (block 870).

At this juncture, it is assumed that the received row X is Ri=[R0, R1, R3]. To the Ri vector the vector [0, SPi XOR D1i) or (SP2i XOR P1i), MPi] is XORed to yield the received strong parity codeword for row X (SRi) (block 875). Strong LDPC decoding is applied to the SRi to yield D0i for each of the non-converged rows (block 880). Where all the rows converge (block 885), the data decoding ends. Alternatively, where the number of remaining errors is not sufficiently reduced to allow the strong decoding to converge (block 887), standard retry decoding is applied to the encoded data set (block 850). Otherwise, strong parity (SP1i) for the newly recovered first user data (D0i) is generated using the original encoding process (block 890). Strong parity (SP1i) is XORed with (SP1i XOR D1i) to recover the original D1 (block 895).

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for out of order data processing. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system, the data processing system comprising:
 a multi-algorithm data encoder circuit operable to:
  receive a user data set that includes a first data portion and a second data portion;
  apply a first level of a first algorithm encoding on a first section by section basis to the first data portion to yield a first encoding data, wherein the first encoding data includes a first encoded portion, a second encoded portion, and a third encoded portion;
  exclusive OR (XOR) the first encoded portion with the second user data set to yield a modified parity block;
  apply a second algorithm encoding on a second section by section basis to the modified parity block to yield a fourth encoded portion;
  apply a second level of the first encoding algorithm on the fourth encoded portion and the modified parity block to yield a fifth encoded portion; and
  XOR the first encoded portion, the second encoded portion, and the third encoded portion with a combination of the modified parity block, the fourth encoded portion, and the fifth encoded portion to yield an encoded data set;
 a multi-algorithm data decoder circuit operable to:
  apply a first level of a first algorithm decoding on the first section by section basis to the encoded data set to yield a first decoded data set;
  apply a second level of the first algorithm encoding to at least one section of the first decoded data set to yield the first encoded portion and the second encoded portion;

XOR the first encoded portion with the second data portion of the at least one section of the first decoded data set to yield a second decoded data set;
apply erasure decoding to the first decoded data set modified by the second decoded data set to recover at least one other section of the first decoded data set to yield a third decoded data set;
apply the second level of the first encoding algorithm to a portion of the third decoded data set to yield a fourth decoded data set;
generate a strong codeword for each of the at least one section of the first decoded data set and the at least one other section of the first decoded data set;
apply a second level of the first algorithm decoding to the generated strong codewords to yield the first user data portion; and
generate the second user data portion based at least in part on the first user data portion.

2. The data processing system of claim 1, wherein the first algorithm encoding is a low density parity check encoding, and wherein the second algorithm encoding is a Reed Solomon encoding.

3. The data processing system of claim 1, wherein the first level of the first algorithm encoding is a strong low density parity check encoding, and wherein the second level of the first algorithm encoding is a medium low density parity check encoding.

4. The data processing system of claim 1, wherein the first algorithm decoding is a low density parity check decoding, and wherein the second algorithm decoding is a Reed Solomon decoding.

5. The data processing system of claim 1, wherein the first level of the first algorithm decoding is a medium low density parity check decoding, and wherein the second level of the first algorithm encoding is a strong low density parity check decoding.

6. The data processing system of claim 1, wherein the first section by section basis is a row by row basis, and the second section by section basis is a column by column basis.

7. The data processing system of claim 1, wherein the system is implemented as an integrated circuit.

8. The data processing system of claim 1, wherein the data processing system is incorporated in a storage device.

9. The data processing system of claim 8, wherein the data processing system is incorporated in a storage device selected from a group consisting of: a hard disk drive, and a solid state drive.

10. A data processing system, the data processing system comprising:
a multi-algorithm data encoder circuit operable to:
apply a first algorithm encoding on a first section by section basis to a user data set yield an encoded portion; and
apply a second algorithm encoding on a second section by section basis to a data set derived from a subset of the encoded portion.

11. The data processing system of claim 10, wherein the first algorithm encoding is a low density parity check encoding, and wherein the second algorithm encoding is a Reed Solomon encoding.

12. The data processing system of claim 10, wherein the first section by section basis is a row by row basis, and the second section by section basis is a column by column basis.

13. The data processing system of claim 10, wherein the user data set is a first data portion, wherein applying the first algorithm encoding on the first section by section basis to the first user data set to yield the encoded portion is applying a first level of the first algorithm encoding on the first section by section basis to the first data portion to yield a first encoding data, wherein the first encoding data includes a first encoded portion, a second encoded portion, and a third encoded portion; and wherein the multi-algorithm data encoder circuit is further operable to:
exclusive OR (XOR) the first encoded portion with the second user data set to yield a modified parity block; and
wherein applying the second algorithm encoding on the second section by section basis to the data set derived from the subset of the encoded portion includes applying the second algorithm encoding on the second section by section basis to the modified parity block to yield a fourth encoded portion.

14. The data processing system of claim 13, wherein the multi-algorithm data encoder circuit is further operable to:
apply a second level of the first encoding algorithm on the fourth encoded portion and the modified parity block to yield a fifth encoded portion; and
XOR the first encoded portion, the second encoded portion, and the third encoded portion with a combination of the modified parity block, the fourth encoded portion, and the fifth encoded portion to yield an encoded data set.

15. The data processing system of claim 14, wherein the first level of the first algorithm encoding is a strong low density parity check encoding, and wherein the second level of the first algorithm encoding is a medium low density parity check encoding.

16. The data processing system of claim 10, wherein the system is implemented as an integrated circuit.

17. The data processing system of claim 10, wherein the data processing system is incorporated in a device selected from a group consisting of: a storage device, and a data transmission device.

18. A data processing system, the data processing system comprising:
a multi-algorithm data decoder circuit operable to:
apply a first level of a first algorithm decoding on the first section by section basis to the encoded data set to yield a first decoded data set;
apply a second level of the first algorithm encoding to at least one section of the first decoded data set to yield the first encoded portion and the second encoded portion;
exclusive OR (XOR) the first encoded portion with the second data portion of the at least one section of the first decoded data set to yield a second decoded data set;
apply erasure decoding to the first decoded data set modified by the second decoded data set to recover at least one other section of the first decoded data set to yield a third decoded data set;
apply the second level of the first encoding algorithm to a portion of the third decoded data set to yield a fourth decoded data set;
generate a strong codeword for each of the at least one section of the first decoded data set and the at least one other section of the first decoded data set;
apply a second level of the first algorithm decoding to the generated strong codewords to yield the first user data portion; and
generate the second user data portion based at least in part on the first user data portion.

19. The data processing system of claim 18, wherein the first algorithm decoding is a low density parity check decoding, and wherein the second algorithm decoding is a Reed Solomon decoding.

20. The data processing system of claim 18, wherein the first level of the first algorithm decoding is a medium low density parity check decoding, and wherein the second level of the first algorithm encoding is a strong low density parity check decoding.

\* \* \* \* \*